US007969259B2

United States Patent
Detlefsen et al.

(10) Patent No.: US 7,969,259 B2
(45) Date of Patent: Jun. 28, 2011

(54) ELECTRONIC COMPONENT OPERATED WITH SURFACE ACOUSTIC WAVES

(75) Inventors: Andreas Detlefsen, Eichonau (DE); Peter Kirchhofer, Munich (DE); Dietmar Ritter, Starnberg (DE)

(73) Assignee: Epcos AG, Munich (DE)

( * ) Notice: Subject to any disclaimer, the term of this patent is extended or adjusted under 35 U.S.C. 154(b) by 903 days.

(21) Appl. No.: 10/544,136

(22) PCT Filed: Dec. 16, 2003

(86) PCT No.: PCT/EP03/14351
§ 371 (c)(1),
(2), (4) Date: Aug. 22, 2005

(87) PCT Pub. No.: WO2004/070947
PCT Pub. Date: Aug. 19, 2004

(65) Prior Publication Data
US 2006/0097824 A1 May 11, 2006

(30) Foreign Application Priority Data
Feb. 4, 2003 (DE) ................................. 103 04 470

(51) Int. Cl.
*H03H 9/64* (2006.01)
(52) U.S. Cl. ........................................ 333/193; 333/195
(58) Field of Classification Search .................. 333/193, 333/195
See application file for complete search history.

(56) References Cited

U.S. PATENT DOCUMENTS

| 3,886,504 | A | * | 5/1975 | Hartmann et al. | 333/195 |
| 5,486,800 | A | * | 1/1996 | Davenport | 333/193 |
| 5,592,135 | A | | 1/1997 | Taguchi et al. | |
| 6,081,172 | A | * | 6/2000 | Strauss et al. | 333/193 |
| 6,377,140 | B1 | * | 4/2002 | Ehara et al. | 333/193 |
| 6,380,827 | B1 | * | 4/2002 | Noguchi | 333/193 |
| 6,504,454 | B2 | * | 1/2003 | Takahashi | 333/195 |
| 6,791,437 | B2 | * | 9/2004 | Hagn et al. | 333/195 |
| 7,304,553 | B2 | * | 12/2007 | Bauer et al. | 333/193 |
| 7,482,895 | B2 | * | 1/2009 | Igaki et al. | 333/195 |
| 2003/0174029 | A1 | | 9/2003 | Baier et al. | |

FOREIGN PATENT DOCUMENTS
DE 19818038 4/1999
(Continued)

OTHER PUBLICATIONS

Office Action cited in Japanese Application No. 2004-567759, dated May 13, 2009, with an English Translation of the Reason for Rejection, 11 pages.

*Primary Examiner* — Robert Pascal
*Assistant Examiner* — Alan Wong
(74) *Attorney, Agent, or Firm* — Fish & Richardson P.C.

(57) ABSTRACT

An apparatus includes a piezoelectric substrate having a signal line with a first electrical port and a second electrical port, and a first partial filter connected in series with a second partial filter. The partial filters are arranged between the electrical ports. The first partial filter includes a first serial transducer and a second serial transducer located in an acoustic path and in series branches of the signal line. The serial transducers are acoustically coupled with one another. The second partial filter includes a coupler transducer and an end-positioned transducer that are located in a double mode surface acoustic wave (DMS) path. The end-positioned transducer is positioned at an end of the signal line.

11 Claims, 13 Drawing Sheets

FOREIGN PATENT DOCUMENTS

| | | |
|---|---|---|
| DE | 19818826 | 4/1999 |
| DE | 10007178 | 8/2001 |
| EP | 0 734 121 | 9/1996 |
| EP | 0 600 705 | 1/1999 |
| EP | 0 757 438 | 8/2001 |
| EP | 1 137 176 | 9/2001 |
| JP | 10-284988 | 10/1998 |
| JP | 2001-267885 | 9/2001 |
| JP | 2001292050 A * | 10/2001 |
| WO | 01 61859 | 8/2001 |
| WO | WO0156151 A1 * | 8/2001 |
| WO | WO0171911 A1 * | 9/2001 |
| WO | WO03081773 A1 * | 2/2003 |

\* cited by examiner ized by slight insertion attenuation. For example, publication
ELECTRONIC COMPONENT OPERATED WITH SURFACE ACOUSTIC WAVES

TECHNICAL FIELD

The invention concerns an assembly that works with surface acoustic waves, in particular a filter with a network structure in which resonators are embedded.

BACKGROUND

In the front-end of terminal devices for mobile communication, for example, in cellular telephones, SAW filters (SAW=surface acoustic wave) are primarily used today as band-pass filters in the HF band. These are, in the main, constructed as reactance or DMS filters (DMS=double mode SAW).

The filters that are to be used in terminal devices for mobile communication should have as small an insertion attenuation of the useful signal as possible. The use of modern modulation methods requires higher selection and opposite-sideband suppression from the filters used in the sending and receiving path, as compared to traditional SAW filters.

There are, for example, circuits made by connecting DMS filters with reactance elements, in particular one-port resonators constructed with the SAW technology that are characterized by slight insertion attenuation. For example, publication DE 198 18 038 A describes a DMS filter in which two DMS filters connected in series or parallel are connected in series with reactance elements at the entrance or the exit side.

Publication DE 100 07 178 A1 describes a DMS filter that is connected with a two-port resonator with two acoustically coupled serial transducers, each of the serial transducers being connected in series with one of the transducers of the DMS filter. In that configuration, the series branches of the circuit are connected between a symmetrically constructed entrance and a symmetrically constructed exit.

SUMMARY

It is the purpose of this invention to describe an assembly that works with surface acoustic waves, has one symmetrical and one asymmetrical port, and has a slight insertion attenuation.

In accordance with the invention, this purpose is fulfilled with an assembly in accordance with claim 1. Advantageous variations of the invention can be derived from the subordinate claims.

The invention describes an assembly working with surface acoustic waves that has a piezoelectric substrate on which structures of the assembly are located. The assembly has a signal line with an asymmetrical first electrical port (preferably an entrance port) and a second electrical port (preferably an exit port). The assembly in accordance with the invention comprises a first and a second partial filter that are connected one behind the other between the first and the second electrical port. Preferably, the second port is symmetrical (balanced); i.e. it has two terminals that carry the signal. It is also possible that the second port is constructed in an asymmetrical manner (unbalanced, single-ended).

The first partial filter contains a first and a second serial transducer that are located in the acoustic path and that are connected within the signal line either one behind the other or parallel to one another; i.e. they are both connected in series in the signal line, the first and the second serial transducers being acoustically coupled with one another.

The second partial filter comprises a DMS path that has a first coupler transducer and a transducer located at the end of the signal line. In the preferred variation of the invention, the DMS path has, in addition, a second coupler transducer.

In the preferred variation of the invention, each path is bounded by reflectors on both sides.

In an advantageous exemplary embodiment of the invention, the first and/or the second coupler transducer of the DMS path is/are each connected with at least one of the serial transducers in series. The second electrical port is preferably connected to the transducer located at the end of the DMS path.

The preferred variation of the invention provides for a first, a second, and a third acoustic path. The first acoustic path contains at least one transducer (parallel transducer) or several parallel transducers that are acoustically coupled with one another. The second acoustic path has a first and a second serial transducer that are acoustically coupled with one another. The third acoustic path is a DMS path and has, in particular, at least two coupler transducers and at least one end-positioned transducer that is preferably located between the coupler transducers. The serial transducers and the parallel transducer or transducers are connected in a ladder-type configuration in which the serial transducers in each case constitute serial resonators having the ladder-type configuration, and the parallel transducer or transducers in each case constitute a parallel resonator having the ladder-type configuration; i.e. they are connected parallel to the signal line against a reference potential (preferably a ground). At least one of the serial transducers is electrically connected with one or several of the coupler transducers of the DMS path, i.e., connected, for example, in series against a reference potential (ground). The signal-conducting terminal of the first electrical port (entrance port) is connected to the second acoustic path. The second electrical port (exit port) is connected to the end-positioned transducer of the DMS path. In all embodiments of the invention, it is always also possible to reverse the assignment of the two electrical ports to the roles of entrance and exit.

In a further embodiment of the invention, the end-positioned transducer of the DMS path has at least two partial transducers that are electrically connected to one another in series between the terminals of the second electrical port.

In an advantageous embodiment of the invention, the DMS path can have additional coupler and/or end-positioned transducers, the coupler transducers and the end-positioned transducers being acoustically coupled with one another and positioned, at least in part, in an alternating manner.

The assembly in accordance with the invention differs from the usual DMS filters with two DMS paths by having a small insertion attenuation. The invention describes a ladder-type structure that is especially space saving, that is connected with a DMS path, and that has particularly steep signal edges of the transfer function and therefore a high selection. Moreover, these features of the invention make it possible to attain a higher and a sufficient image-frequency suppression than with familiar electroacoustic components having comparable dimensions of the transducers.

DESCRIPTION OF THE DRAWINGS

In the following, the invention is explained in more detail using exemplary embodiments and the figures relating to them. The figures serve only for explanation and are not to scale. Identical or identically functioning elements are identified with the same reference symbols.

FIG. 1 shows an assembly in accordance with the invention in a schematic representation (FIG. 1a) and as a corresponding equivalent circuit (FIG. 1b).

FIGS. 1c to 7 show advantageous specific embodiments of an assembly in accordance with the invention having a DMS path located at the exit side.

DETAILED DESCRIPTION

FIG. 1 shows the basic manner of construction of an assembly in accordance with the invention in principle. The assembly has a first acoustic path, S1, a second acoustic path, S2, and a DMS path, S3, that are electrically connected with one another. The first and the second acoustic paths form a first partial filter, the third acoustic path forms a second partial filter.

The first path, S1, has a parallel transducer, W1, that is located between reflectors R11 and R12. The second acoustic path, S2, contains a first serial transducer, W21, and a second serial transducer, W22, that is acoustically coupled with the first; these two transducers are bounded on both sides at each end of the path by reflectors R21 and R22. The first serial transducer, W21, is connected to the signal-conducting terminal P1 of an entrance port. The serial transducers W21 and W22 are each located in a series branch of the first and second basic member of a ladder-type configuration and the parallel transducer, W1, is positioned in the parallel branch of the ladder-type configuration. In this exemplary embodiment, the transducers W21, W22, and W1 form a T-branch of a well-known ladder-type configuration. The ladder-type structure configured in this manner is also electrically connected with coupler transducers AW31, AW32 of DMS path, S3. The coupler transducers AW31, AW32 of the DMS path are acoustically coupled with the end-positioned transducer, MW3. The end-positioned transducer, MW3, is connected with terminals P21, P22 of an exit port. Here, the exit port is constructed as a symmetrical, electrical port. The DMS path is bounded on both sides by reflectors R31 and R32.

It is possible that the first acoustic path, S1, has additional parallel transducers, W1, preferably acoustically coupled with one another, that are each located in parallel branches of the ladder-type configuration. It is also possible that a second acoustic path, S2, has more than only two serial transducers that are preferably acoustically coupled with one another and are each located in series branches of the signal line, for example, each of them in a series branch of different basic members of the ladder configuration. In that configuration, it is possible that the afore-mentioned serial transducers are each electrically connected in series with the coupler transducers AW31 and AW32 of the DMS path.

Moreover, the invention can provide for an additional DMS path being cascade-connected with the DMS path, S3. It is also possible that an additional acoustic path, connected in series in the signal line, with serial transducers that are acoustically connected with one another and that are bounded on both sides by reflectors, be located at the entrance side.

Figure 1B:
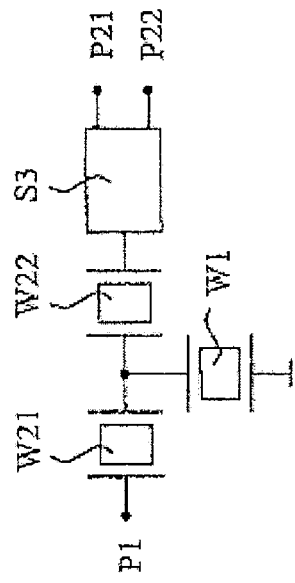
Figure 1A:
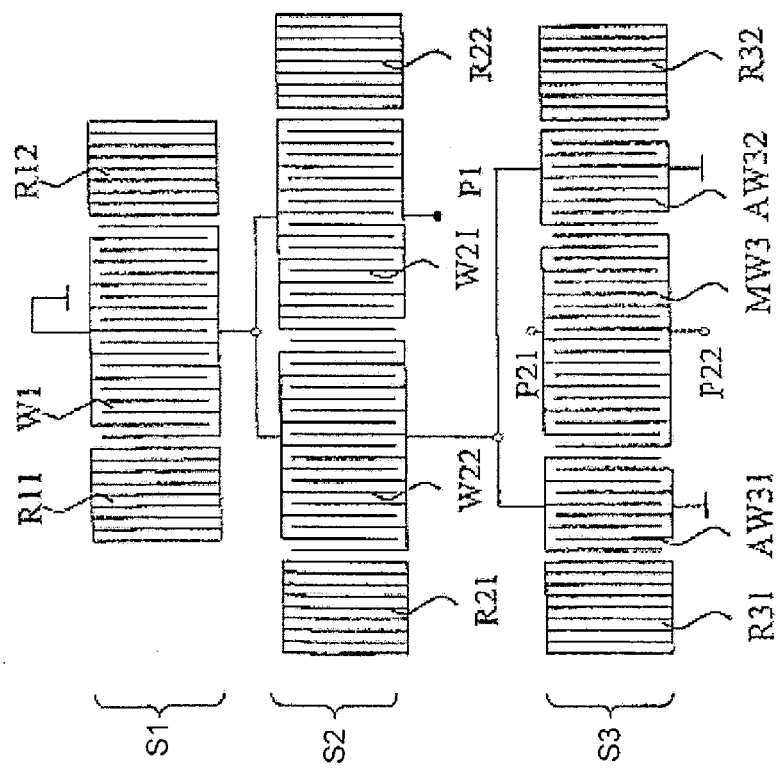

In FIG. 1b, the equivalent circuit corresponding to the assembly as represented in FIG. 1a is shown.

Figure 1C:
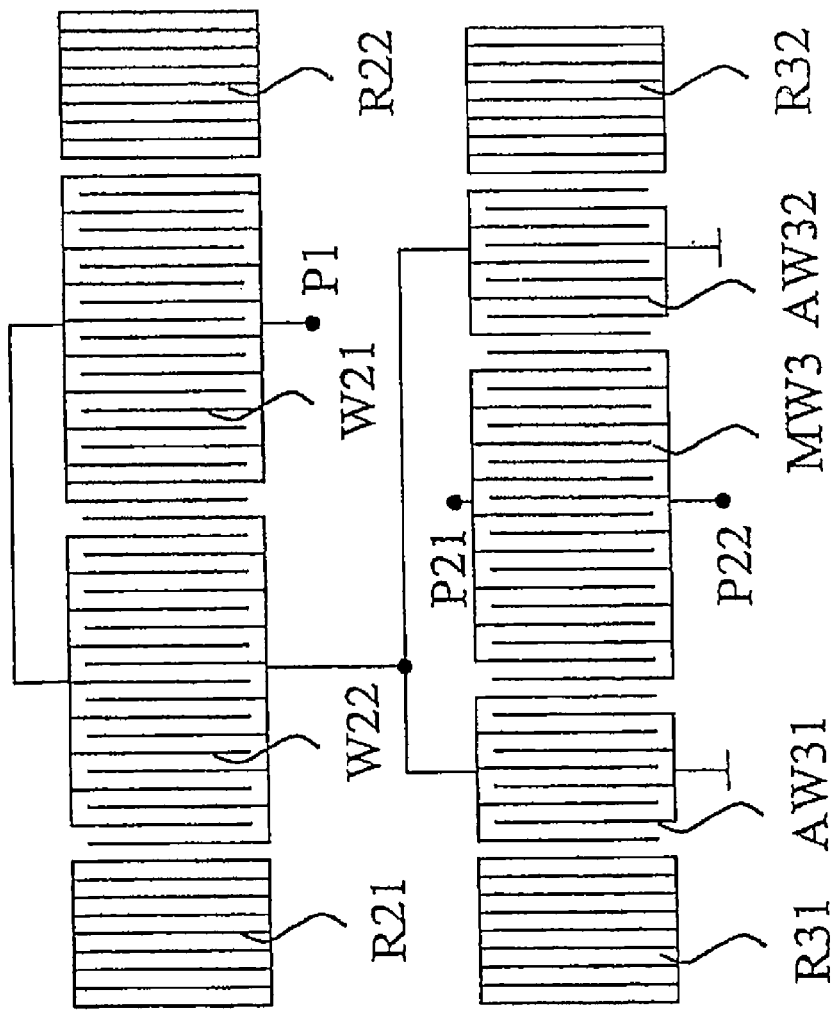

In FIG. 1c, the serial transducers W21 and W22 form a series connection between the entrance port and the coupler transducers, AW31, AW32 of the DMS path. The first serial transducer W21 is connected to the entrance port. The second serial resonator, which is acoustically coupled with the first serial transducer, W21, is connected, on the one hand, with the first serial transducer, W21, and on the other hand, with the coupler transducers, AW31, AW32, of the DMS path.

Figure 1D:
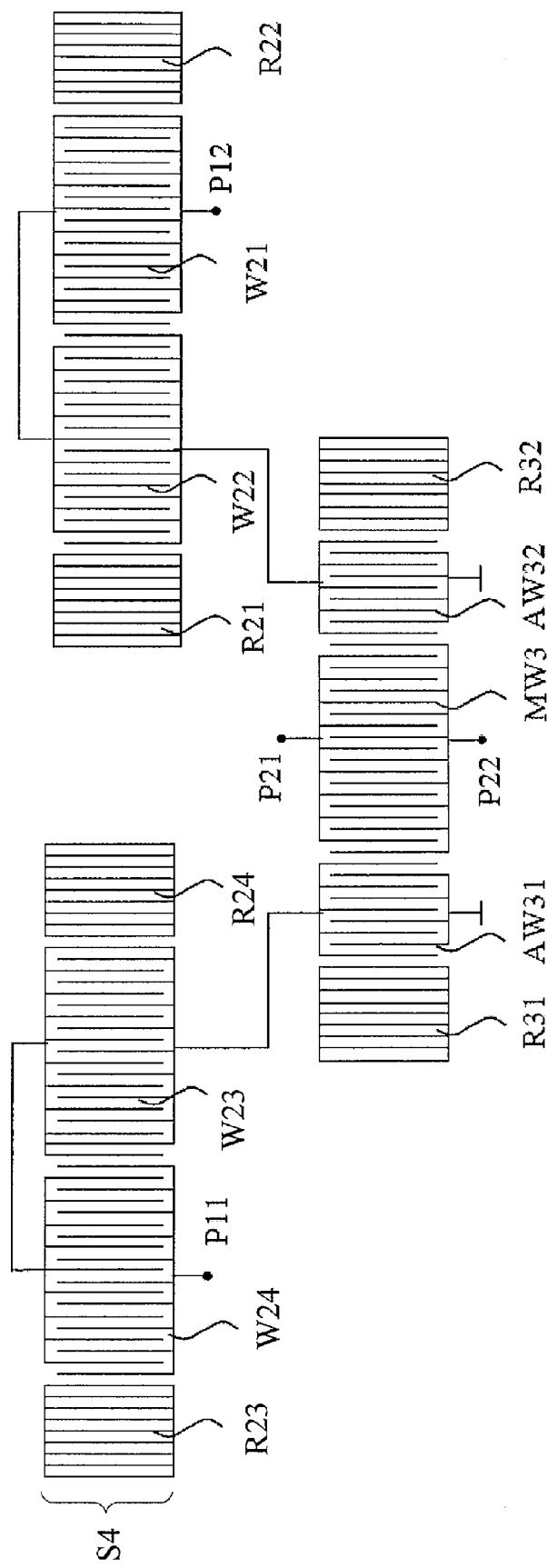

In some embodiments, the first partial filter can include an additional acoustic path that has at least one serial transducer. For example, FIG. 1d illustrates a variation of the embodiment of FIG. 1c in which the first partial filter includes an additional acoustic path, S4, containing a pair of serial transducers, W23 and W24, acoustically coupled with one another; these two transducers are bounded on both sides at each end by reflectors R23 and R24. The additional acoustic path can be connected with the first electrical port and can be located along the signal line. As shown in FIG. 1d, a first path connects a first terminal P11 of the first port (entrance port) and a first coupler transducer AW31 in the second partial filter, and a second path connects the a second terminal P12 of the first port and a second coupler transducer AW32 in the second partial filter.

Figure 2:
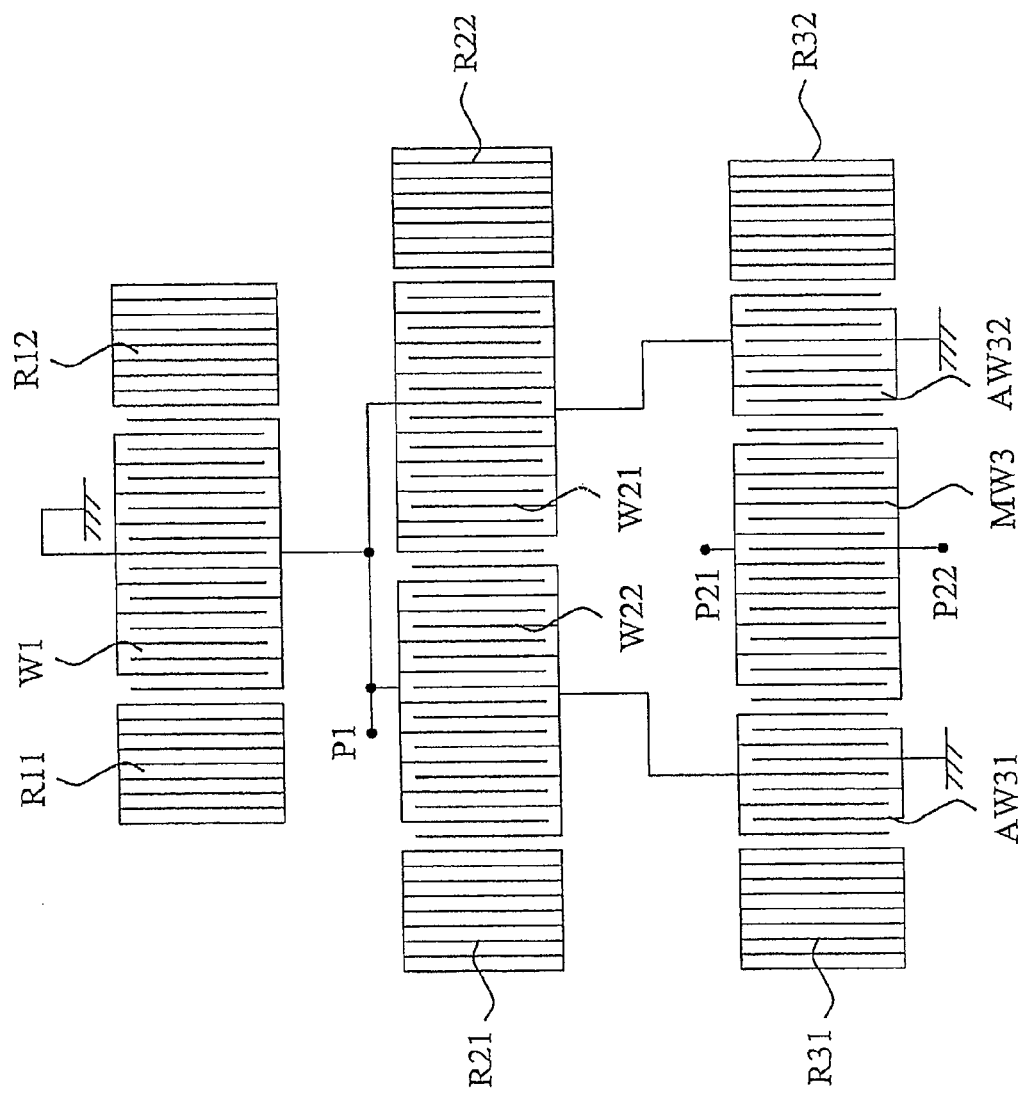

FIG. 2 shows a further advantageous exemplary embodiment of the invention. Here, the entrance port is connected to the parallel transducer, W1. In this configuration, the series terminal of the second serial transducer, W22, and of the first coupler transducer, AW31, of the DMS path, on the one hand, and, on the other hand, the series connection of the first serial transducer, W21, and of the second coupler transducer, AW32, of the DMS path are connected parallel to the parallel transducer, W1.

Figure 3:
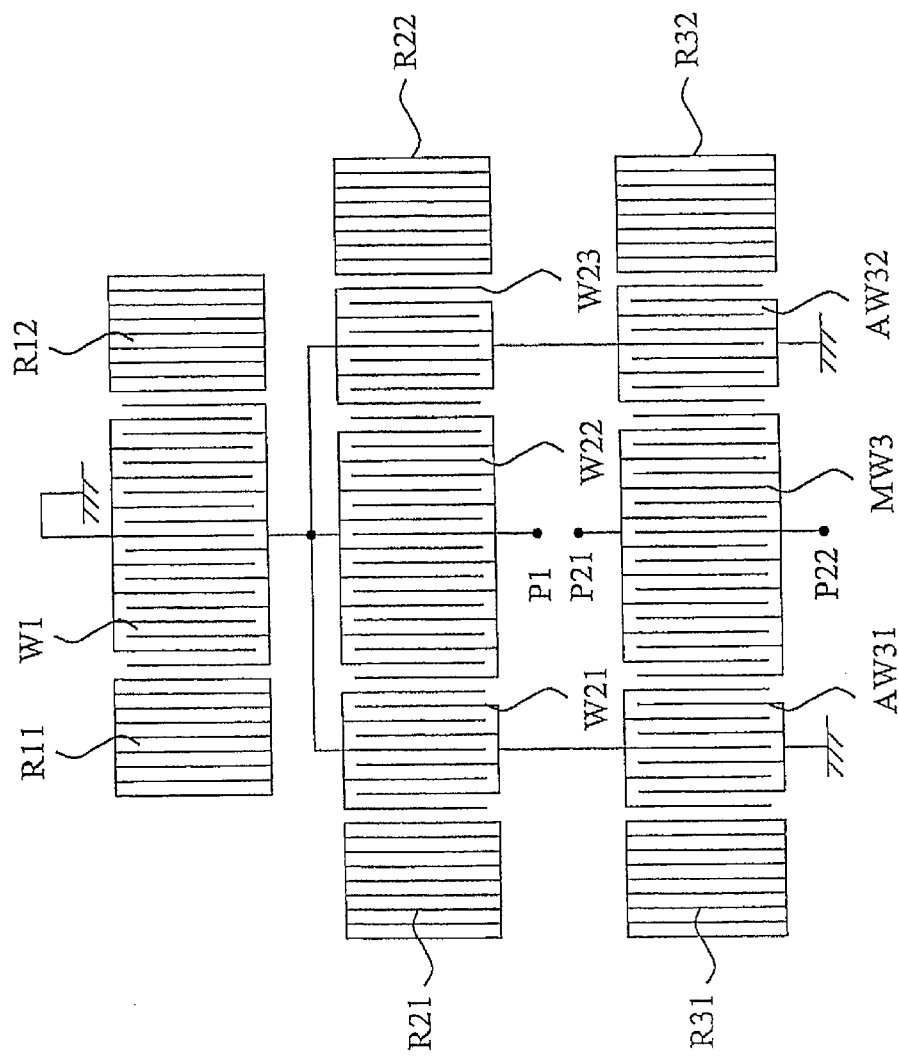

FIG. 3 shows a further variation of the assembly in accordance with the invention. The second acoustic path has a first, a second, and a third serial transducer (W21, W22, and W23). The first serial transducer, W21, of the second acoustic path is connected electrically with the first coupler transducer, AW31, of the DMS path. The third serial transducer, W23, of the second acoustic path is electrically connected with the coupler transducer, AW32, of the DMS path. The signal-conducting terminal P1 of the entrance port is connected with the second serial transducer, W22, of the second acoustic path. Connected in series to the second serial transducers W22, are the first and third serial transducers, W21, W23, the two mentioned last being connected parallel to each other.

Figure 4:
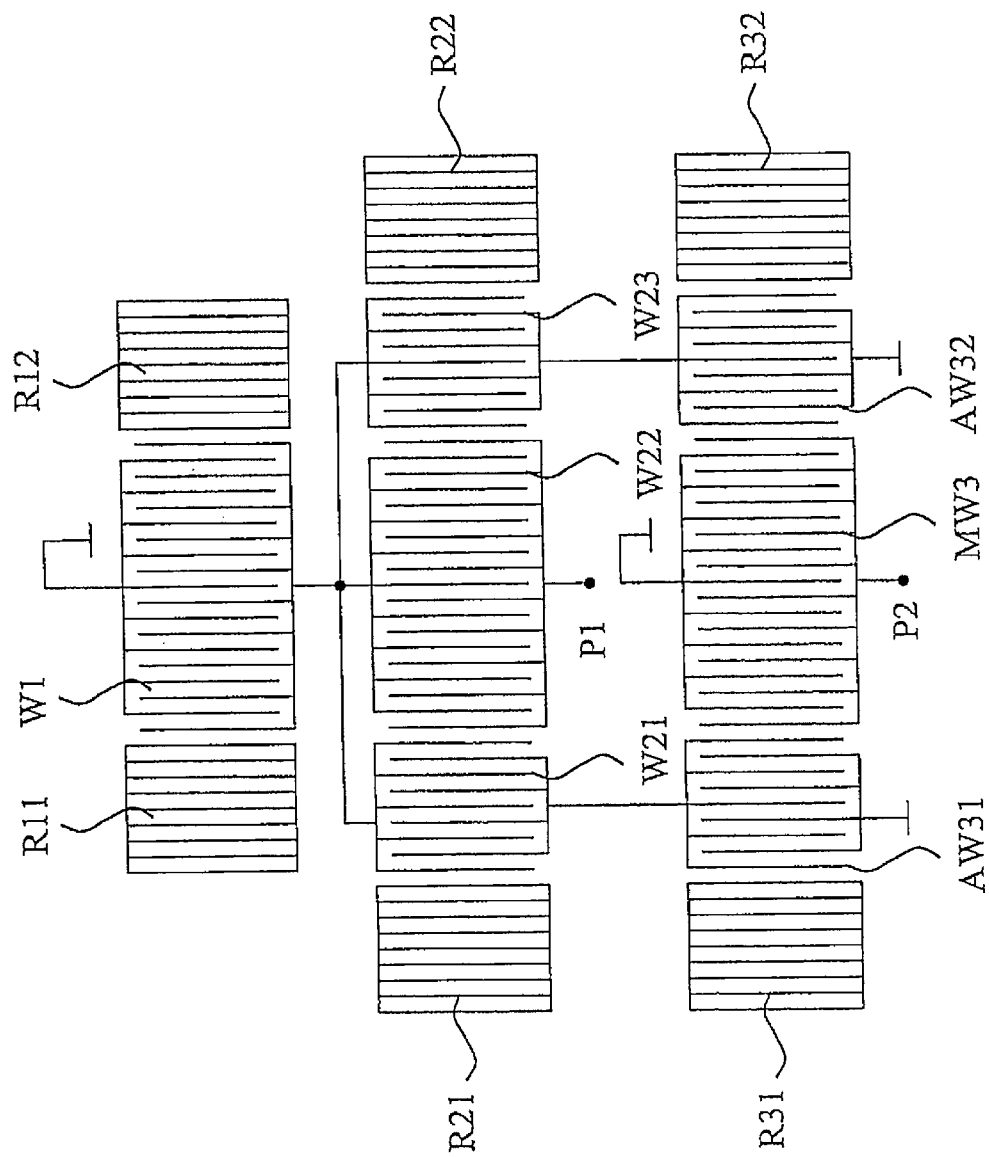

FIG. 4 shows a variation of the assembly in accordance with the invention with an output port that is constructed as an asymmetric electrical port with a signal-conducting terminal, P2.

Figure 5:
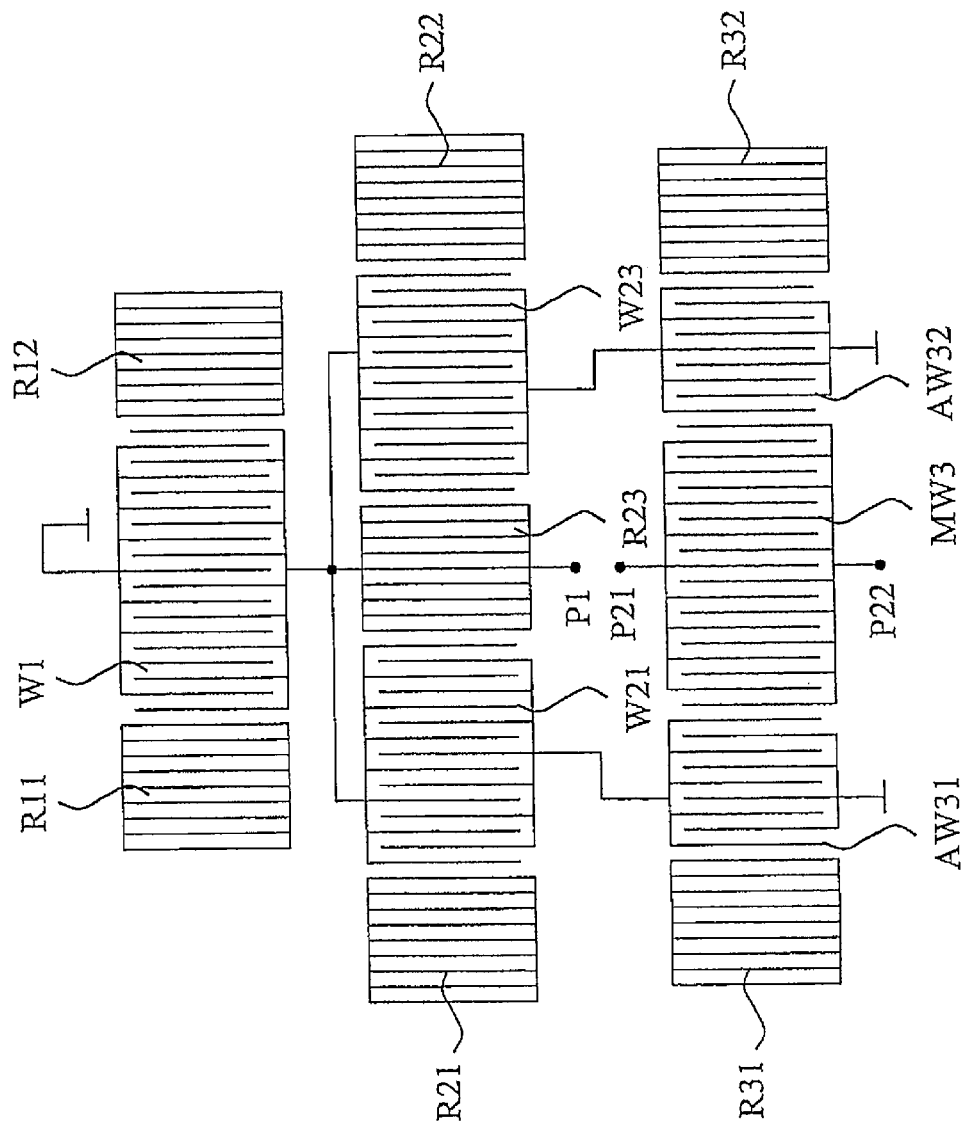

The signal-conducting terminal, P1, of the input port can, as shown in FIG. 5, be connected to a reflector, R23, that is located between the serial transducers, W21 and W23, of the second acoustic path. In particular, this reflector makes it possible to adjust the acoustic coupling between the serial transducers that surround it.

Figure 6:
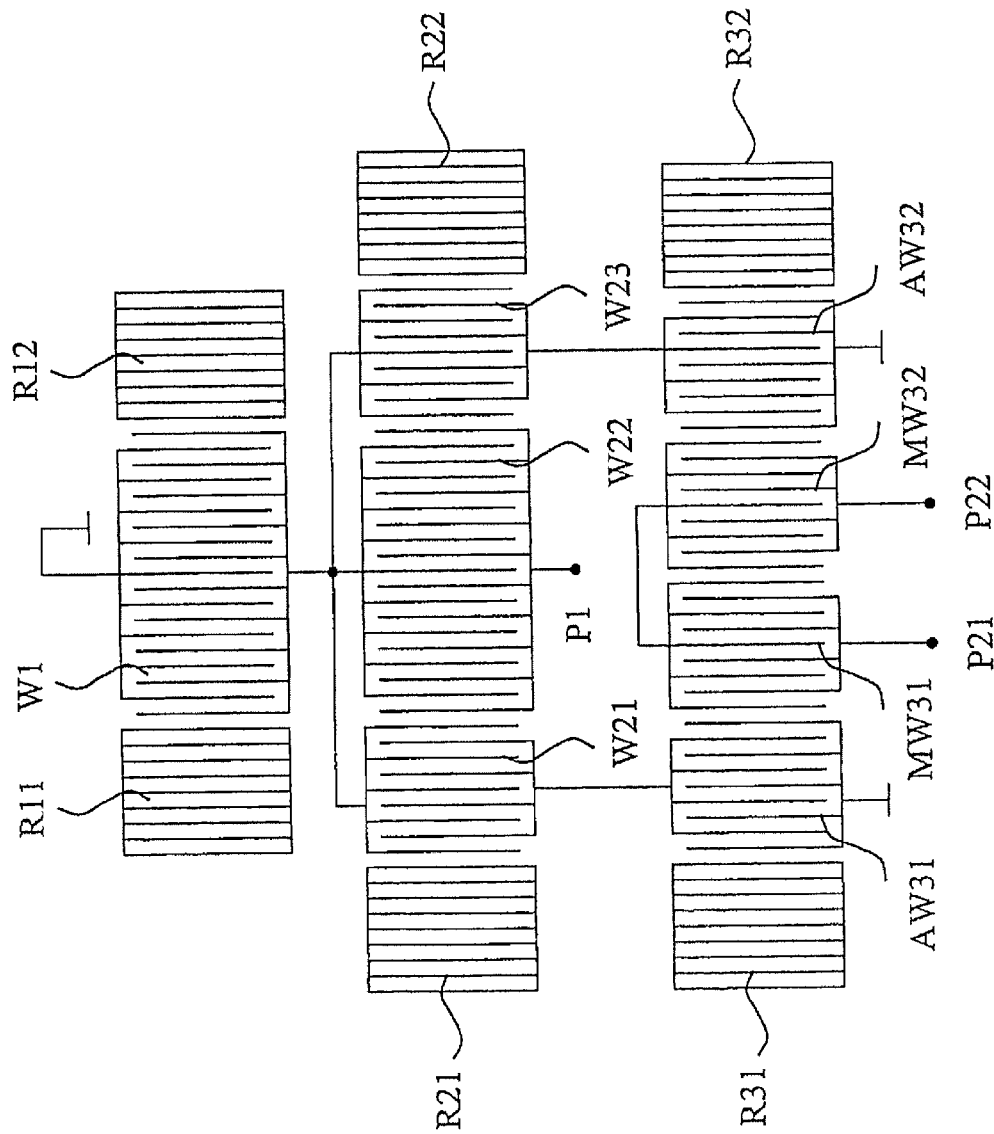

In the assembly in accordance with the invention that is shown in FIG. 6, partial transducers MW31 and MW32 are used instead of the end-positioned transducer, MW3. The partial transducers MW31 and MW32 are connected in series between terminals P21 and P22 of the output port in such a way that the signals at terminals P21 and P22 are antiphasic. The series connection of partial transducers MW31 and MW32 corresponds to a split transducer; however, it is possible in this variation to achieve a transducer impedance that is higher by a factor of 4 with the same number of electrode fingers in comparison with the transducer that is not split.

Figure 7:
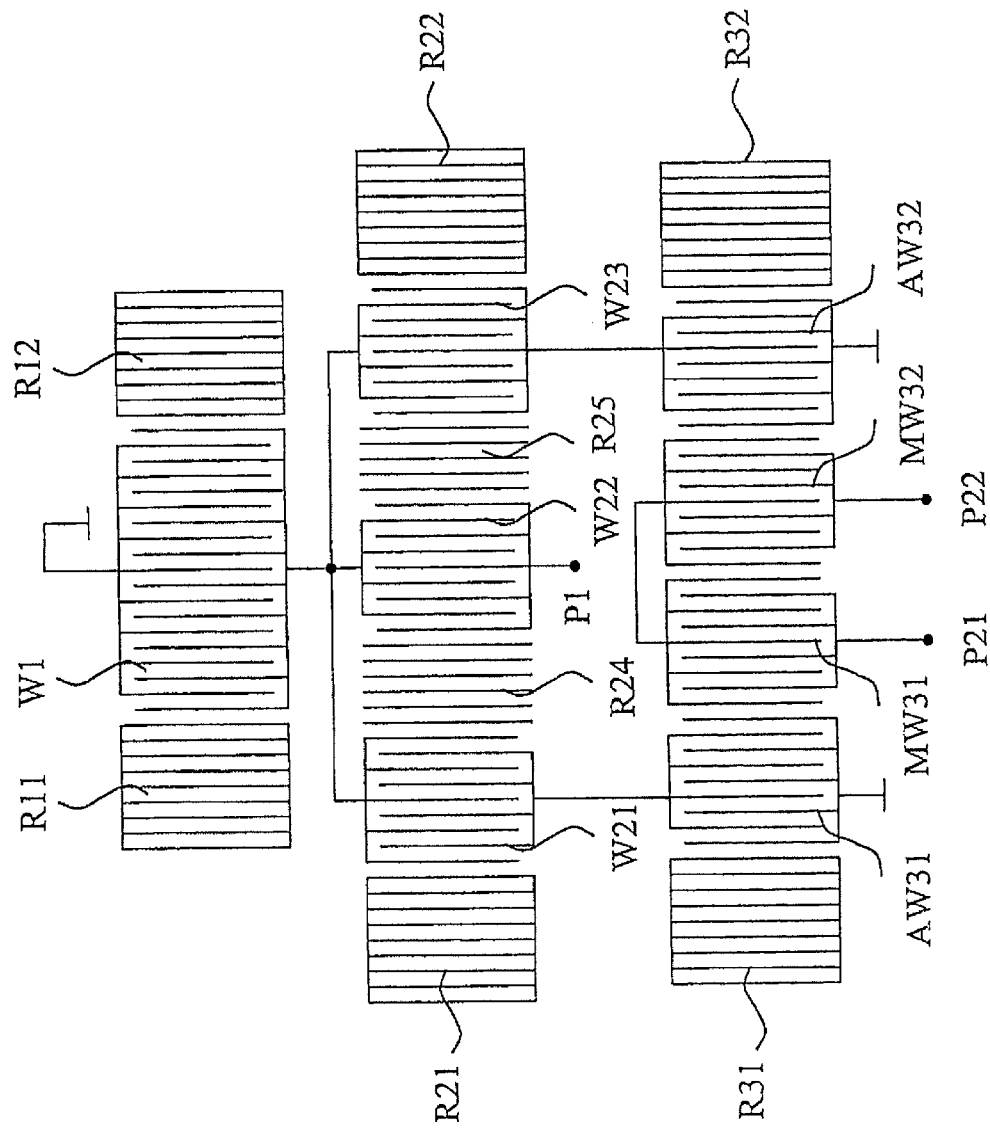

In one variation, a reflector is placed between transducers of the first (or second) acoustic path that are located next to each other. With the reflector that is placed between the acoustically coupled transducers, it is possible, for example, to modify the acoustic coupling. In FIG. 7, a reflector, R24, is placed in the second acoustic path between the serial transducers W21 and W22, and a reflector, R25, is placed between the serial transducers W22 and W23. In each case, the reflectors can have metal strips that are connected to one another. It is also possible that the metal strips of a particular reflector are not connected with one another.

Figure 8:
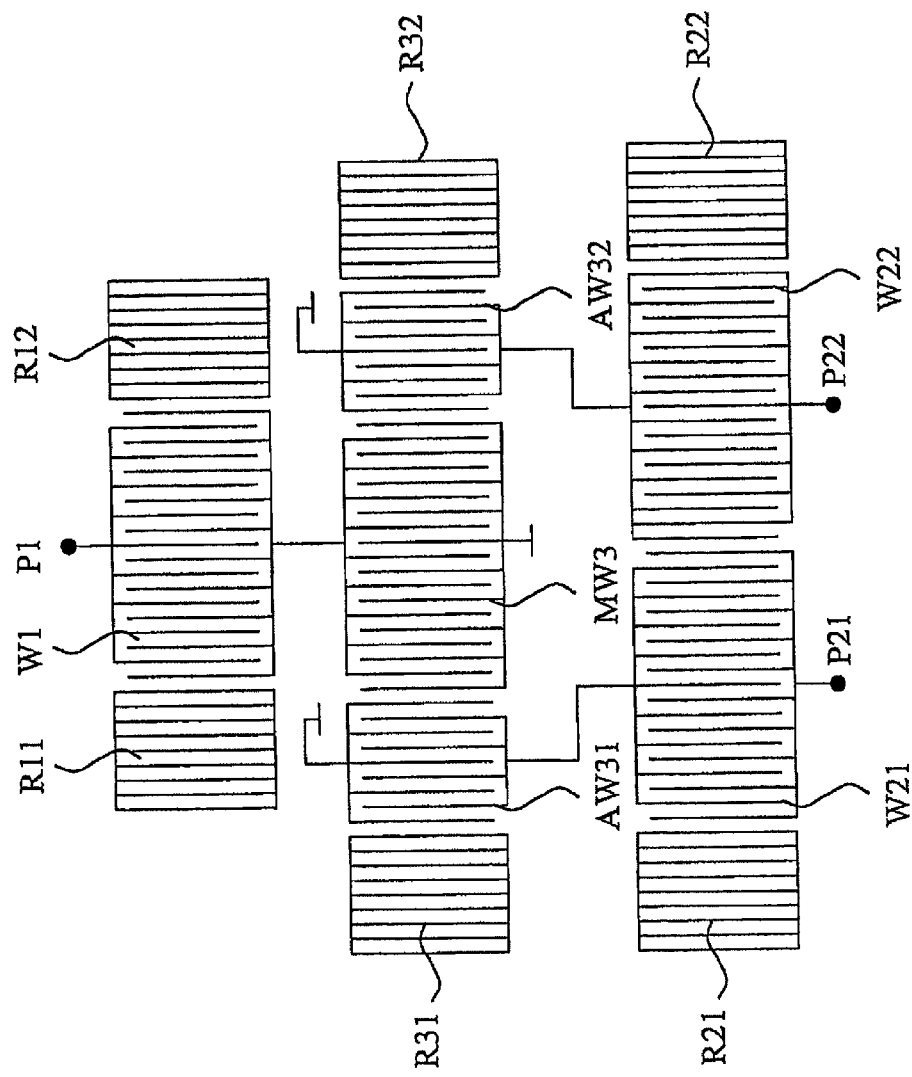
FIGS. 8 to 11 show advantageous specific embodiments of an assembly in accordance with the invention having a DMS path located at the entrance side.

In FIG. 8, the second partial filter (the DMS path) is located on the side of the first port (input port). The end-positioned transducer, MW3, of the DMS path is connected with the signal line in series and acoustically coupled with the coupling transducers AW31 and AW32. The end-positioned transducer, MW3, of the DMS path and a serial resonator that includes a transducer, W1, and reflectors R11 and R12 are connected in series between the signal-conducting terminal P1 of the first port and a reference potential (ground). The first AW31 and the second AW32 coupler transducer are connected with the first W21 and the second W22 serial transducer in series between the first, P21, and the second, P22, signal-conducting terminal of the second port (output port) and a reference potential (ground). In this configuration, the first terminal, P21, of the second port is connected to the first serial transducer, W21, and the second terminal, P22, of the second port is connected to the second serial transducer, W22.

Figure 9:
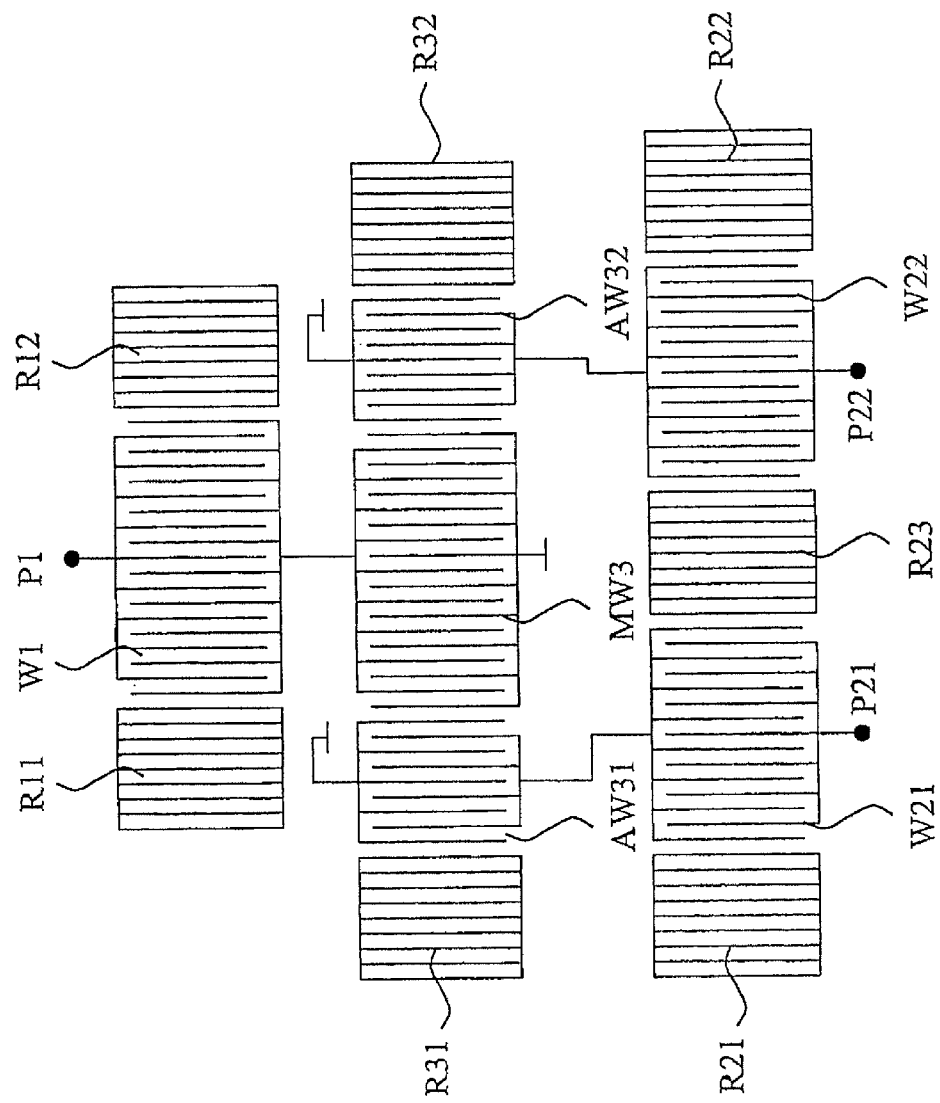

In the embodiment of the assembly in accordance with the invention that is shown in FIG. 9, a reflector, R23, is placed between the first serial transducer, W21, and the second serial transducer, W22, for the purpose of controlling the acoustic coupling between the two transducers.

Figure 10:
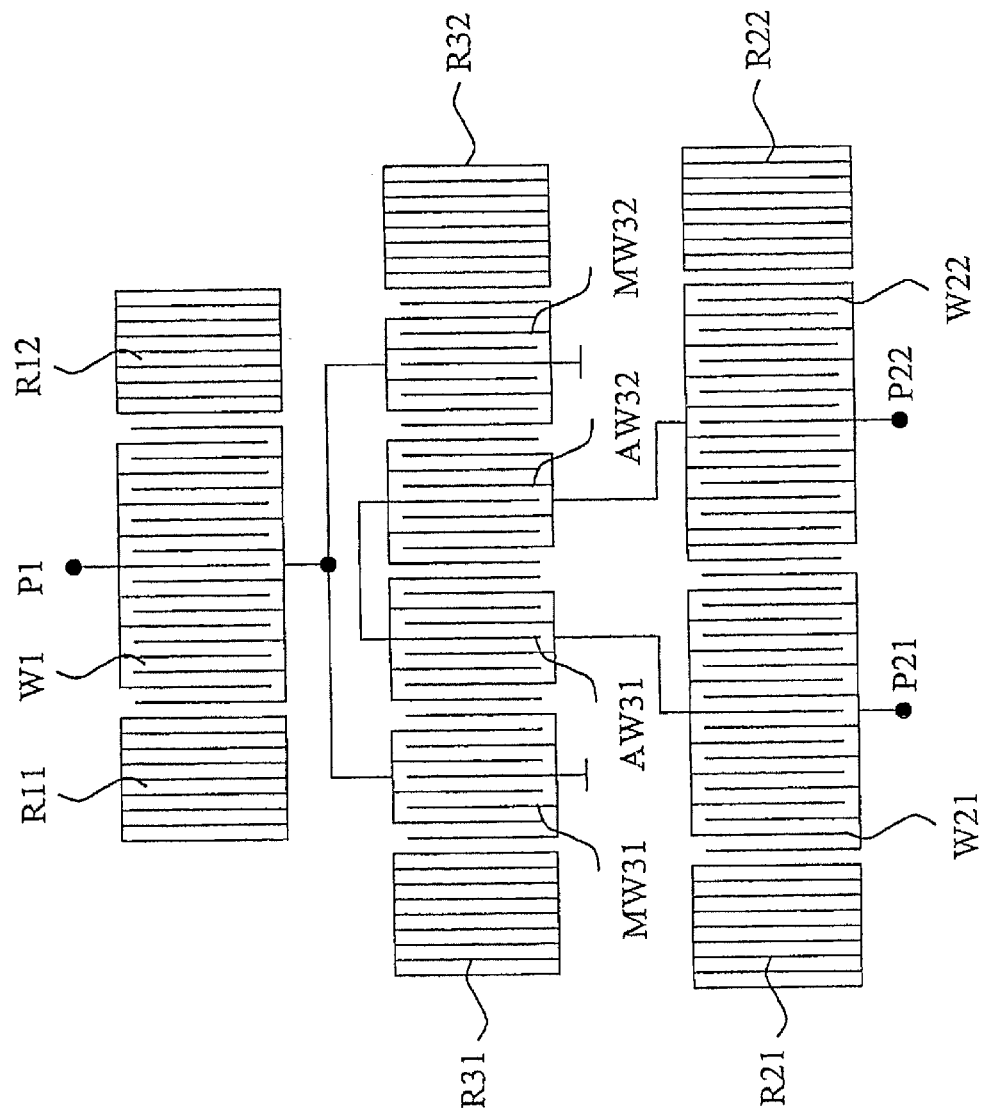

In the next exemplary embodiment schematically represented in FIG. 10, the DMS path has two end-positioned transducers, MW31 and MW32, on the input side. The end-positioned transducers, MW31 and MW32, are located in a series branch of the signal line and are connected parallel to one another. Here, the coupler transducers AW31 and AW32 are placed next to each other between the end-positioned transducers MW31 and MW32. The coupler transducers AW31 and AW32 can be constructed as partial transducers of a transducer that are connected with one another in such a way that they deliver electrically antiphasic signals. The transducers W21, AW31, AW32 and W22, are connected one behind the other between the first, P21, and the second, P22, terminal of the second port. The first serial transducer, W21, is connected to the first terminal, P21, and the second serial transducer, W22, to the second terminal, P22, of the second port.

Figure 11:
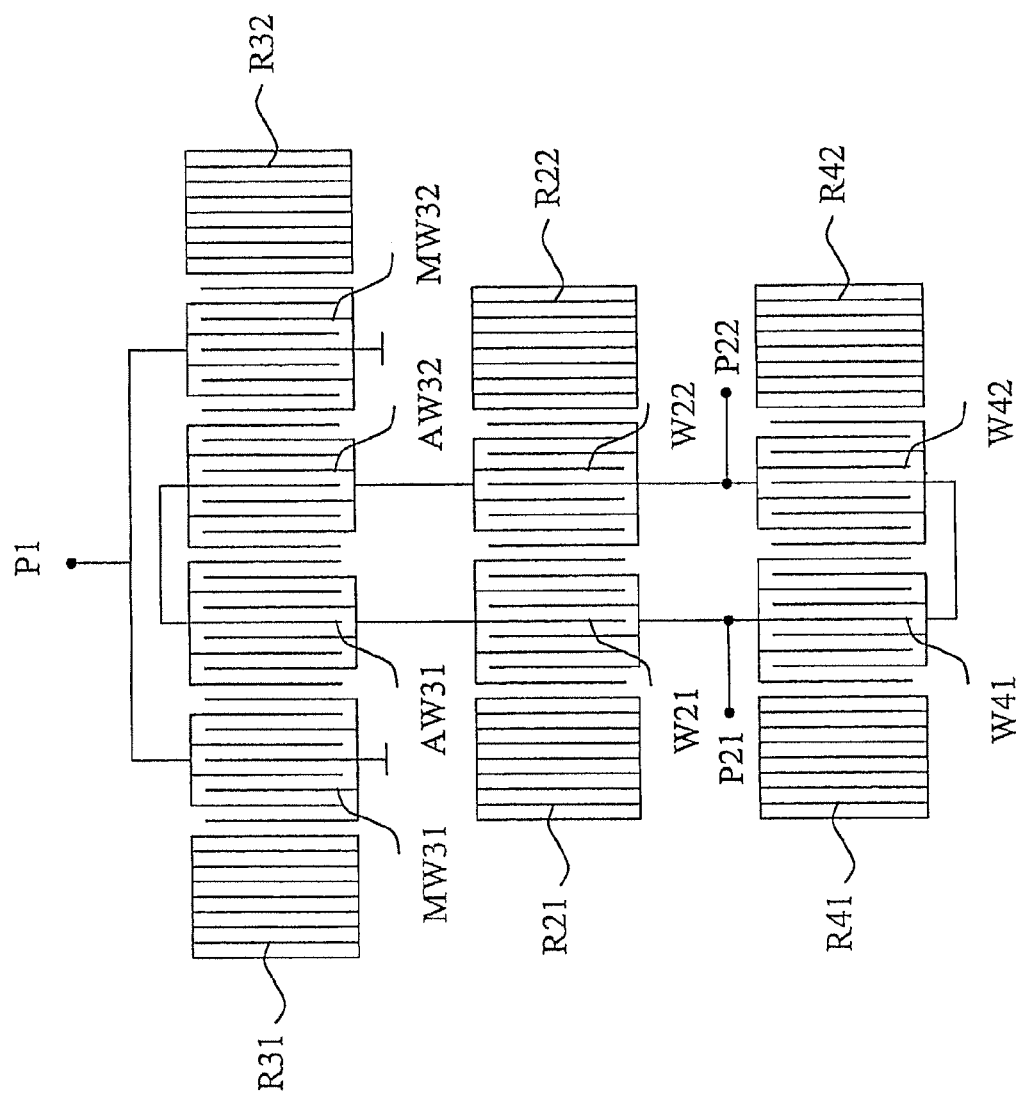

In FIG. 11, a further advantageous version of an embodiment of the invention is shown. The signal-conducting terminal, P1, of the first port is connected with the end-positioned transducers MW31 and MW32. The end-positioned transducers, MW31, MW32, are, on the other hand, connected to a reference potential. The way in which the coupler transducers AW31 and AW32 are connected with the serial transducers W21 and W22 corresponds to the description in FIG. 10. The second electrical port is connected to an additional acoustic path with a first transducer, W42, and a second transducer, W41, that are bounded on both sides by reflectors R41, R42. In this configuration, the first terminal, P21, of the second port is connected to the first transducer, W41, and the second terminal, P22, of the second port is connected to the second transducer, W42.

The first transducer, W41, and the second transducer, W42, are acoustically coupled with one another and connected in series.

The assembly in accordance with the invention that has on one side (preferably at the entrance) an asymmetric electrical port and, on the opposite side, (preferably at the exit) a symmetric electrical port, has the advantage that, in addition to the function of a filter, it also fulfills the function of a balun. This solution is particularly advantageous for mobile radio devices, inasmuch as it is possible, when the assembly in accordance with the invention is used, to save space at the level of the end device and to keep losses small by omitting a balun (which is usually made as a discrete component) or through integration of the balun function into a front-end filter.

The figures render the invention only schematically so that a better explanation of the invention is possible. For this reason, the representations are not to scale and also render the outer geometric shape only schematically. Further, the invention is not limited to the details that are presented in the figures, but also includes the possibilities of variation that have been mentioned already, as well as additional embodiments that are conceivable within the scope of the claims.

The invention claimed is:

1. An apparatus comprising:
   a piezoelectric substrate comprising:
      a signal line comprising a first electrical port and a second electrical port;
      a first partial filter;
      a second partial filter electrically connected in series with the first partial filter, the first partial filter and the second partial filter being between the first and the second electrical ports; and
      a serial resonator electrically connected between the first electrical port and an end-positioned transducer, the serial resonator having a constituent transducer and reflectors that bound the constituent transducer on both sides, the reflectors being directly adjacent the constituent transducer;
   wherein:
      the first partial filter comprises:
         a first serial transducer and a second serial transducer in series branches of the signal line, the first serial transducer and the second serial transducer being in an acoustic path and acoustically coupled with one another, and the first serial transducer and the second serial transducer being electrically connected in series with respect to the signal line, and
         a reflector between the first serial transducer and the second serial transducer, the reflector having a reflectivity that is less than 100%; and
      the second partial filter comprises a first coupler transducer and the end-positioned transducer that are in a double mode surface acoustic wave (DMS) path, the end-positioned transducer being positioned at a signal end of the second partial filter.

2. The apparatus of claim 1, wherein the first electrical port comprises an asymmetrical electrical port having a signal-conducting terminal.

3. The apparatus of claim 1, wherein the second electrical port comprises a symmetrical electrical port having multiple signal-conducting terminals.

4. The apparatus of claim 1, wherein each of the acoustic path and the DMS path are bounded on both sides by reflectors.

5. The apparatus of claim 1, wherein the second partial filter further comprises one or more of the following: a second coupler transducer and a second end-positioned transducer.

6. The apparatus of claim 5, wherein the first and second coupler transducers and the end-positioned transducers in the DMS path are arranged substantially alternately.

7. The apparatus of claim 1, wherein the reflector is configured to adjust an acoustic coupling between the first serial transducer and the second serial transducer.

8. The apparatus of claim 1, wherein the second partial filter further comprises a second coupler transducer.

9. The apparatus of claim 8, wherein the end-positioned transducer is between the first coupler transducer and the second coupler transducer.

10. An apparatus comprising:
a piezoelectric substrate comprising:
- a signal line comprising a first electrical port and a second electrical port, the first electrical port comprising an asymmetrical electrical port;
- a first partial filter;
- a second partial filter electrically connected in series with the first partial filter, the first partial filter and the second partial filter being between the first and the second electrical ports; and
- a serial resonator electrically connected between the first electrical port and an end-positioned transducer, the serial resonator having a constituent transducer and reflectors that bound the constituent transducer on both sides, the reflectors being directly adjacent the constituent transducer, wherein:
- the first partial filter comprises a first serial transducer and a second serial transducer located in series branches of the signal line, the first serial transducer and the second serial transducer being located in an acoustic path and acoustically coupled with one another, and
- the second partial filter comprises a first coupler transducer, a second coupler transducer, and an end-positioned transducer that are located in a double mode surface acoustic wave (DMS) path, the end-positioned transducer being positioned at a signal end of the second partial filter;
- a first signal-conducting terminal of the second electrical port is electrically connected to the first serial transducer;
- a second signal-conducting terminal of the second electrical port is electrically connected to the second serial transducer;
- the end-positioned transducer is arranged along the signal line that is electrically connected to the first electrical port;
- the first coupler transducer is electrically connected in series with the first serial transducer; and
- the second coupler transducer is electrically connected in series with the second serial transducer.

11. An apparatus comprising:
a piezoelectric substrate comprising:
- a signal line comprising a first electrical port and a second electrical port, the first electrical port comprising an asymmetrical electrical port;
- a first partial filter;
- a second partial filter electrically connected in series with the first partial filter, the first partial filter and the second partial filter being between the first and the second electrical ports, and the second partial filter comprising at least two end-positioned transducers; and
- a serial resonator electrically connected between the first electrical port and one of the at least two end-positioned transducers, the serial resonator having a constituent transducer and reflectors that bound the constituent transducer on both sides, the reflectors being directly adjacent the constituent transducer;

wherein:
- the first partial filter comprises a first serial transducer and a second serial transducer in series branches of the signal line, the first serial transducer and the second serial transducer being in an acoustic path and acoustically coupled with one another; and
- the second partial filter further comprises a first coupler transducer and a second coupler transducer, the first coupler transducer and the second coupler transducer being electrically connected in series and arranged next to each other.

* * * * *

UNITED STATES PATENT AND TRADEMARK OFFICE
CERTIFICATE OF CORRECTION

PATENT NO. : 7,969,259 B2
APPLICATION NO. : 10/544136
DATED : June 28, 2011
INVENTOR(S) : Andreas Detlefsen, Peter Kirchhofer and Dietmar Ritter It is certified that error appears in the above-identified patent and that said Letters Patent is hereby corrected as shown below:

ON THE TITLE PAGE:
Item (75) Inventors: replace "Andreas Detlefsen, Eichonau (DE);" with
-- Andreas Detlefsen, Eichenau (DE); --

Signed and Sealed this
Thirtieth Day of August, 2011

David J. Kappos
*Director of the United States Patent and Trademark Office*